United States Patent
Sakaguchi et al.

(10) Patent No.: US 10,600,552 B2
(45) Date of Patent: Mar. 24, 2020

(54) SURFACE-MOUNTED REACTOR AND MANUFACTURING METHOD THEREFOR

(71) Applicant: HITACHI METALS, LTD., Tokyo (JP)

(72) Inventors: Mutsuhito Sakaguchi, Tottori (JP); Akira Itoh, Tottori (JP); Ryouji Zenitani, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 64 days.

(21) Appl. No.: 15/566,401

(22) PCT Filed: Mar. 28, 2016

(86) PCT No.: PCT/JP2016/059910
§ 371 (c)(1),
(2) Date: Oct. 13, 2017

(87) PCT Pub. No.: WO2016/170927
PCT Pub. Date: Oct. 27, 2016

(65) Prior Publication Data
US 2018/0122552 A1 May 3, 2018

(30) Foreign Application Priority Data

Apr. 23, 2015 (JP) .................................. 2015-088388

(51) Int. Cl.
*H01F 27/28* (2006.01)
*H01F 27/26* (2006.01)
(Continued)

(52) U.S. Cl.
CPC .......... *H01F 27/266* (2013.01); *H01F 17/045* (2013.01); *H01F 27/255* (2013.01);
(Continued)

(58) Field of Classification Search
CPC .......... H01F 3/08; H01F 27/266; H01F 27/29; H01F 27/292; H01F 27/365; H01F 27/32;
(Continued)

(56) References Cited

U.S. PATENT DOCUMENTS

| 5,345,209 A * | 9/1994 | Saitoh | H01F 17/043 336/134 |
| 5,382,937 A * | 1/1995 | Saitoh | H01F 21/06 336/134 |

(Continued)

FOREIGN PATENT DOCUMENTS

| JP | 2009-111314 A | 5/2009 |
| JP | 2013-026419 A | 2/2013 |

OTHER PUBLICATIONS

International Preliminary Report on Patentability dated Nov. 2, 2017 with English translation of Written Opinion in counterpart international application No. PCT/JP2016/059910.

(Continued)

*Primary Examiner* — Mang Tin Bik Lian
(74) *Attorney, Agent, or Firm* — Sughrue Mion, PLLC

(57) ABSTRACT

The invention is directed to a surface mountable reactor including: a coil 60; a first magnetic core 5 including an axial portion 5a around which the coil 60 is disposed and flange portions 5b and 5c at both ends thereof; a second magnetic core 10 disposed outside the coil 60 to connect the flange portions of the first magnetic core 5; and a resin mount 30 disposed outside the coil 60, wherein the second magnetic core 10 includes a plurality of components 10a and 10b separable toward outside the coil 60, the circumference of the coil 60 is surrounded by the second magnetic core 10 and the resin mount 30, and the coil 60 has end portions 65 disposed outside the resin mount 30, and to a method for fabrication thereof.

18 Claims, 15 Drawing Sheets

(51) Int. Cl.
    *H01F 17/04*     (2006.01)
    *H01F 27/255*     (2006.01)
    *H01F 37/00*     (2006.01)
    *H01F 27/29*     (2006.01)
    *H01F 27/32*     (2006.01)
    *H01F 27/36*     (2006.01)
    *H01L 49/02*     (2006.01)

(52) U.S. Cl.
    CPC .......... *H01F 27/263* (2013.01); *H01F 27/292* (2013.01); *H01F 27/32* (2013.01); *H01F 27/365* (2013.01); *H01F 37/00* (2013.01); *H01L 28/10* (2013.01); *H01F 2017/046* (2013.01)

(58) Field of Classification Search
    CPC ...... H01F 27/255; H01F 27/263; H01F 27/06; H01F 27/24; H01F 27/26; H01F 17/045; H01F 2017/046; H01F 2027/297; H01L 28/10
    USPC ..................... 336/192, 233, 65, 83, 198, 208
    See application file for complete search history.

(56) References Cited

U.S. PATENT DOCUMENTS

| | | | | |
|---|---|---|---|---|
| 5,751,203 A * | 5/1998 | Tsutsumi | ................. | H01F 3/14 336/192 |
| 7,839,249 B2 * | 11/2010 | Tseng | ................... | H01F 27/266 336/131 |
| 2004/0135660 A1 * | 7/2004 | Holdahl | .................... | H01F 3/14 336/90 |
| 2007/0241850 A1 * | 10/2007 | Watanabe | ............ | H01F 27/027 336/73 |
| 2008/0143466 A1 * | 6/2008 | Monma | ................. | H01F 17/045 336/83 |
| 2009/0237196 A1 * | 9/2009 | Watanabe | ............. | H01F 27/027 336/210 |
| 2009/0315658 A1 * | 12/2009 | Sano | .................... | H01F 17/045 336/65 |
| 2010/0026441 A1 * | 2/2010 | Wedley | .................... | H01F 3/12 336/221 |
| 2011/0001595 A1 * | 1/2011 | Kudo | .................... | H01F 17/045 336/192 |
| 2014/0160819 A1 * | 6/2014 | Inaba | ........................ | H01F 1/26 363/123 |
| 2014/0176291 A1 * | 6/2014 | Zheng | .................. | H01F 27/255 336/233 |

OTHER PUBLICATIONS

International Search Report of PCT/JP2016/059910 dated Jun. 7, 2016.

Communication dated Nov. 16, 2018, from European Patent Office in counterpart application No. 16782949.8.

* cited by examiner

Cross-sectional view taken along arrow A-A line

SURFACE-MOUNTED REACTOR AND MANUFACTURING METHOD THEREFOR

CROSS REFERENCE TO RELATED APPLICATIONS

This application is a National Stage of International Application No. PCT/JP2016/059910 filed Mar. 28, 2016 (claiming priority based on Japanese Patent Application No. 2015-088388 filed Apr. 23, 2015), the contents of which are incorporated herein by reference in their entirety.

TECHNICAL FIELD

The invention relates to a surface mountable reactor for use in a variety of power supplies, electronic devices, and other applications, and to a method for fabrication of the surface mountable reactor.

BACKGROUND ART

Reactors are used in inverter circuits for power supplies for use in home electric appliances such as air conditioners, motor-driven vehicles such as hybrid vehicles and electric vehicles, solar photo-voltaic devices, and other applications. Reactors are used, for example, to remove high-frequency components from AC power and to suppress power supply ripple associated with rectification. When such reactors are mounted together with other parts on circuit boards with limited mount regions, a magnetic shield structure for forming a closed magnetic circuit is required so that reactors can be surface-mounted in a limited area with no magnetic influence on other parts adjacent thereto.

FIG. 25 shows one of such surface mountable reactors. This surface mountable reactor, which is disclosed in Patent Document 1, includes an air core coil 101 of a flat conductor wire, a case 105 with terminals, and a pair of magnetic cores 109 with an E-shaped cross-section. The magnetic core 109, which is in what is called the EP form, includes a middle leg portion 110, an outer leg portion 111, and a connecting portion 112 connecting them.

The case 105 with terminals includes a rectangular frame 118 formed with terminals 119; and wall portions 106 and 107. One wall portion 106 of the two wall portions 106 and 107 has an arc-shaped surface on the distal side from the frame 118, and the coil 101 is inserted from the opening 115 side into the space defined by the wall portions 106 and 107.

Each wall portion 107 has a hole 108 formed in a position corresponding to the air core 102 of the coil 101, and a tubular member 121 made of an insulating material is inserted into the air core 102 of the coil 101. The components are assembled in such a manner that the case 105 with terminals is sandwiched between the pair of magnetic cores 109, the middle leg portion 110 of each magnetic core 109 is inserted into the tubular member 121 from outside the wall portion 107 and inserted into the air core 102 of the coil 101, and the end faces of the middle and outer leg portions 110 and 111 of the magnetic cores 109 are brought into contact with one another. Each end portion of the coil 101 is extended from the opening 115 of the frame 118, bent to cover the terminal 119 of the frame 118, and soldered, so that a surface mountable reactor with a magnetic shield structure is obtained.

PRIOR ART DOCUMENTS

Patent Documents

Patent Document 1: JP-A-2009-111314

SUMMARY OF THE INVENTION

Problems to be Solved by the Invention

In the surface mountable reactor described in Patent Document 1, the end faces of the middle leg portions 110 of the magnetic cores 109 have the same shape and area, and the end faces of the outer led portions 111 of the magnetic cores 109 also have the same shape and area. Even being a closed magnetic circuit structure, this structure can easily cause a reduction in the area of the butt-contact surface and thus a reduction or variation in the inductance value of the reactor if a misalignment occurs when the magnetic cores 109 are assembled. In addition, the butt-contact surfaces of the middle leg portions 110 are formed inside the coil 101, which allows leakage magnetic flux to intersect with the coil 101, so that an eddy current loss can occur to increase heat generation. The butt-contact surfaces of the outer leg portions 111 are perpendicular the magnetic flux. Therefore, the magnetic flux leaking from the butt-contact surfaces may have an influence as noise on other parts mounted on the circuit board.

Also in the surface mountable reactor described in Patent Document 1, the core composed of the middle leg portion 110, the outer leg portion 111, and the connecting portion 112 connecting them has a complicated shape, which can cause problems such as a limited variety of materials usable for magnetic core molding and difficulty in obtaining sufficient magnetic characteristics depending on the material and molding pressure.

It is therefore an object of the invention to provide a surface mountable reactor having a magnetic core composed of components each with an easily formable shape and also having a magnetic shield structure that allows a significant reduction in the influence of misalignment between a plurality of components assembled to form a combination of magnetic cores, and to provide a method for fabricating such a surface mountable reactor.

Means for Solving the Problem

A surface mountable reactor of the present invention comprises: a coil; a first magnetic core comprising an axial portion around which the coil is disposed and flange portions at both ends of the axial portion; a second magnetic core that is disposed outside the coil to connect the flange portions of the first magnetic core; and a resin mount disposed outside the coil, wherein the second magnetic core comprises a plurality of components separable toward outside the coil, a circumference of the coil is surrounded by the second magnetic core and the resin mount, and the coil has end portions disposed outside the resin mount.

In the present invention, it is preferable that the coil is an edgewise coil comprising a flat conductor wire, and the end portions of the coil are extended through holes of the resin mount to form mount terminals. In this case, it is preferable that the mount terminals are formed of both end portions of the coil that are allowed to protrude out of the resin mount and bent in opposite directions from protruding parts of the end portions to an outer or inner part of the resin mount along a winding axis direction of the coil. Also, it is preferable that the two mount terminals are located in a 180-degree rotationally symmetric manner in a plane where the mount terminals are disposed.

The surface mountable reactor of the present invention preferably has a hexahedral structure, wherein the flange portions of the first magnetic core form two opposed faces of the hexahedral structure, the second magnetic core forms other three faces, and the resin mount covers another side surface of the coil between the flange portions of the first magnetic core and forms remaining one face.

Also, the resin mount preferably comprises a pair of wall portions that are so located that the coil is placed between the wall portions along a winding axis direction of the coil; magnetic core receiving portions provided outside the wall portions; and a coil receiving portion provided between the wall portions. In this case, it is preferable that the magnetic core receiving portions of the resin mount have openings at end surfaces opposed in a winding axis direction of the coil, and front ends of end portions of the coil are inserted in the openings.

It is preferable that the first magnetic core comprises a component serving as the axial portion and components serving as the flange portions, and the components serving as the flange portions each have a recess in which an end of the component serving as the axial portion is engaged.

It is preferable that the surface mountable reactor further comprises a resin provided to seal the coil in a space defined by the first magnetic core and the second magnetic core.

It is preferable that the flange portions of the first magnetic core each have a peripheral surface in contact with an inner surface of the second magnetic core facing the coil. Especially, in the invention, it is preferable that the flange portions of the first magnetic core are each a plate-shaped member having, at a periphery, two parallel sides and other sides linked to the two parallel sides, one component of the second magnetic core has a cross-section comprising an inner linear portion along one of the two parallel sides; and an inner curved portion along one of the other sides, wherein the cross-section is perpendicular to a winding axis direction of the coil, another component of the second magnetic core has a cross-section comprising: an inner linear portion along another of the two parallel sides; and an inner curved portion along one of the other sides, wherein the cross-section is perpendicular to the winding axis direction of the coil, and the one component and the another component are assembled to form the second magnetic core. In this case, the surface mountable reactor preferably further comprises a sealing member provided to connect the components of the second magnetic core.

Also, the surface mountable reactor preferably further comprises a cover member provided to fix the first magnetic core and the second magnetic core to the resin mount.

In this invention, the first magnetic core preferably comprises a dust core comprising a magnetic metal material, and the second magnetic core comprises a ferrite magnetic core comprising a ferrite material.

On the other hand, a method for fabricating a surface mountable reactor of the present invention comprises: a coil; a first magnetic core comprising an axial portion around which the coil is disposed and flange portions at both ends of the axial portion; a second magnetic core that is disposed outside the coil to connect the flange portions of the first magnetic core; and a resin mount disposed outside the coil, wherein the second magnetic core comprises a plurality of components separable toward outside the coil, a circumference of the coil is surrounded by the second magnetic core and the resin mount, and the coil has end portions disposed outside the resin mount, the method comprising a first step comprising assembling a first magnetic core, one component for forming a second magnetic core, and another component for forming the second magnetic core, wherein the first magnetic core comprises an axial portion around which the coil is disposed and flange portions that are each a plate-shaped member having, at a periphery, two parallel sides and other sides linked to the two parallel sides, the one component for forming the second magnetic core has a cross-section comprising: an inner linear portion along one of the two parallel sides; and an inner curved portion along one of the other sides, wherein the cross-section is perpendicular to a winding axis direction of the coil, the another component for forming the second magnetic core has a cross-section comprising: an inner linear portion along another of the two parallel sides; and an inner curved portion along one of the other sides, wherein the cross-section is perpendicular to the winding axis direction of the coil, and the first magnetic core, the one component for forming the second magnetic core, and the another component for forming the second magnetic core are assembled in such a manner that peripheral surfaces of the flange portions of the first magnetic core are brought into contact with an inner surface of the second magnetic core facing the coil.

In this invention, the method preferably further comprises, after the first step, a second step comprising inserting end portions of the coil into holes provided in the resin mount. Also, the method preferably further comprises, after the second step, a third step comprising forming mount terminals by bending both end portions of the coil, which protrude out or the resin mount, in opposite directions from protruding parts of the end portions to an outer or inner part of the resin mount along a winding axis direction of the coil.

Effect of the Invention

According to the invention, the first magnetic core including an axial portion and flange portions at both ends of the axial portion can be formed separately from the second magnetic core for connecting the flange potions. In addition, the second magnetic core is composed of a plurality of components separable toward outside the coil. Therefore, the components of the magnetic cores can each have an easily formable shape. In addition, the axial portion has no divided structure at a middle portion, which means no reduction in the area of butt-contact surface even when the flange portions are displaced, so that displacement-induced reduction or variation in inductance value can be suppressed. In addition, the second magnetic core are composed of components separable toward outside, which prevents the butt-contact surface from being perpendicular to the direction of the magnetic flux and thus allows a reduction in the influence of misalignment between the components.

Therefore, the invention makes at possible to provide a surface mountable reactor having a magnetic core composed of components each with an easily formable shape and also having a magnetic shield structure that allows a significant reduction in the influence of misalignment between a plurality of components assembled to form a combination of magnetic cores, and also makes it possible to provide a method for fabricating such a surface mountable reactor.

MODE FOR CARRYING OUT THE INVENTION

Figure 1:
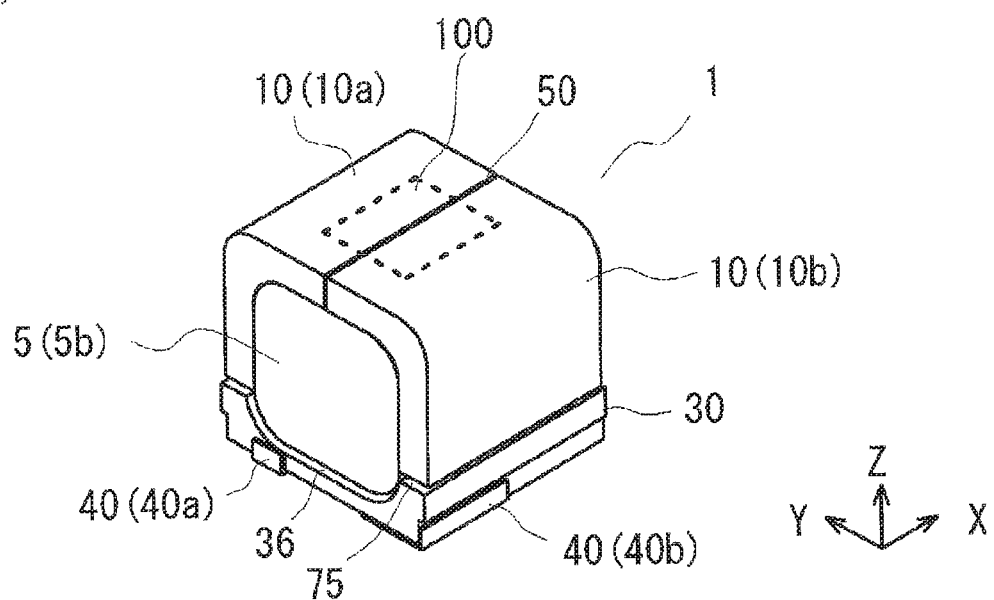
FIG. 1 is a perspective view of a surface mountable reactor according to an embodiment of the invention.
Figure 2:
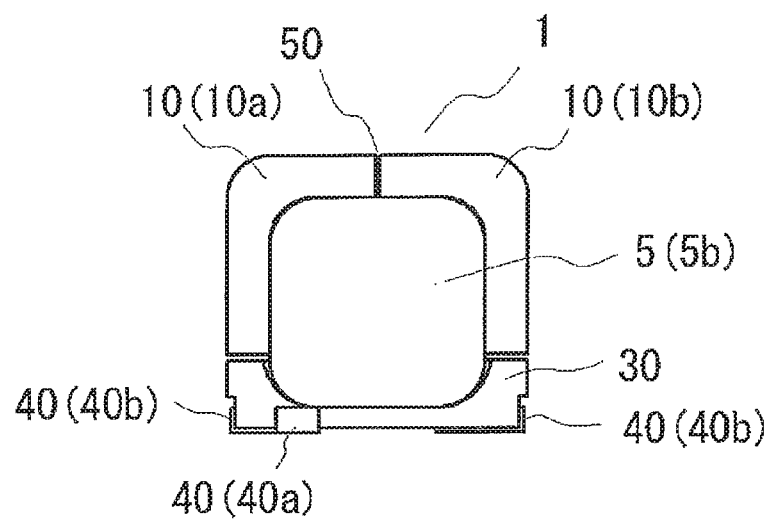
FIG. 2 is a front view of the surface mountable reactor according to an embodiment of the invention.
Figure 3:
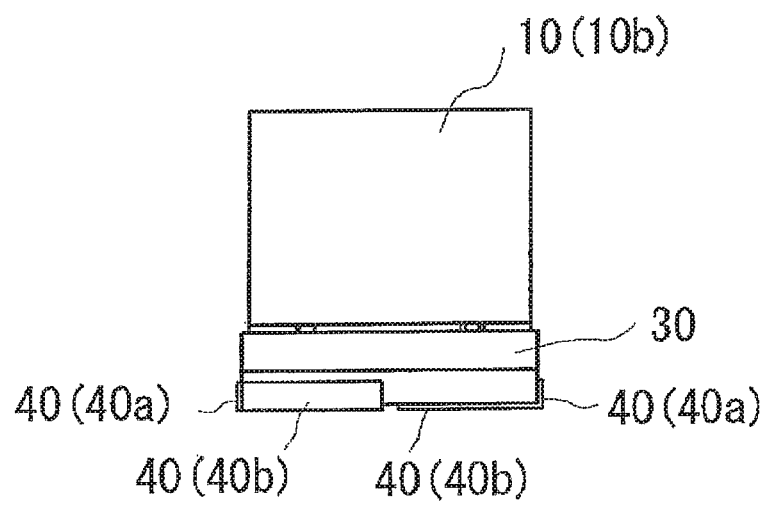
FIG. 3 is a side view of the surface mountable reactor according to an embodiment of the invention.
Figure 4:
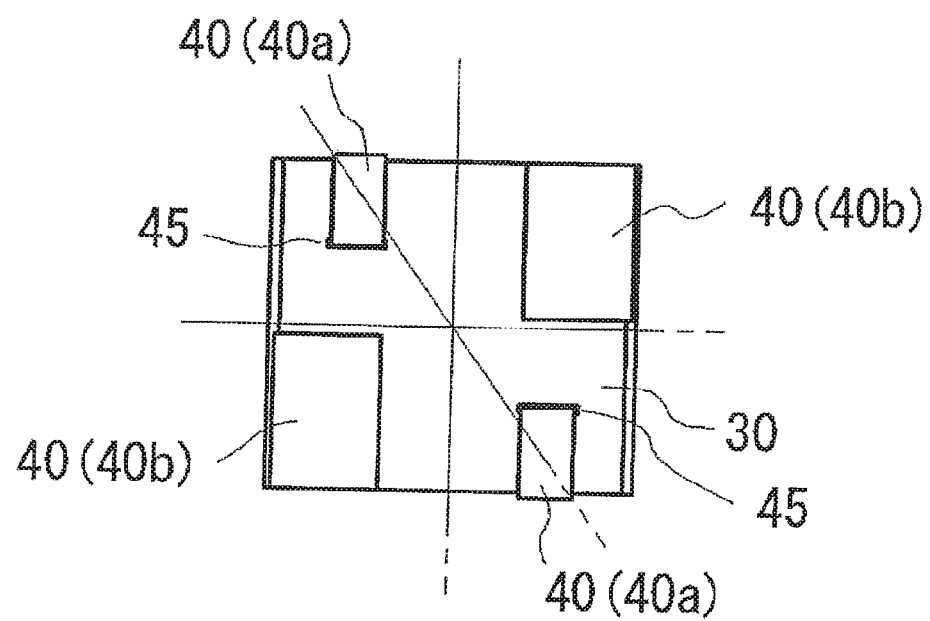
FIG. 4 is a bottom view of the surface mountable reactor according to an embodiment of the invention.
Figure 5:
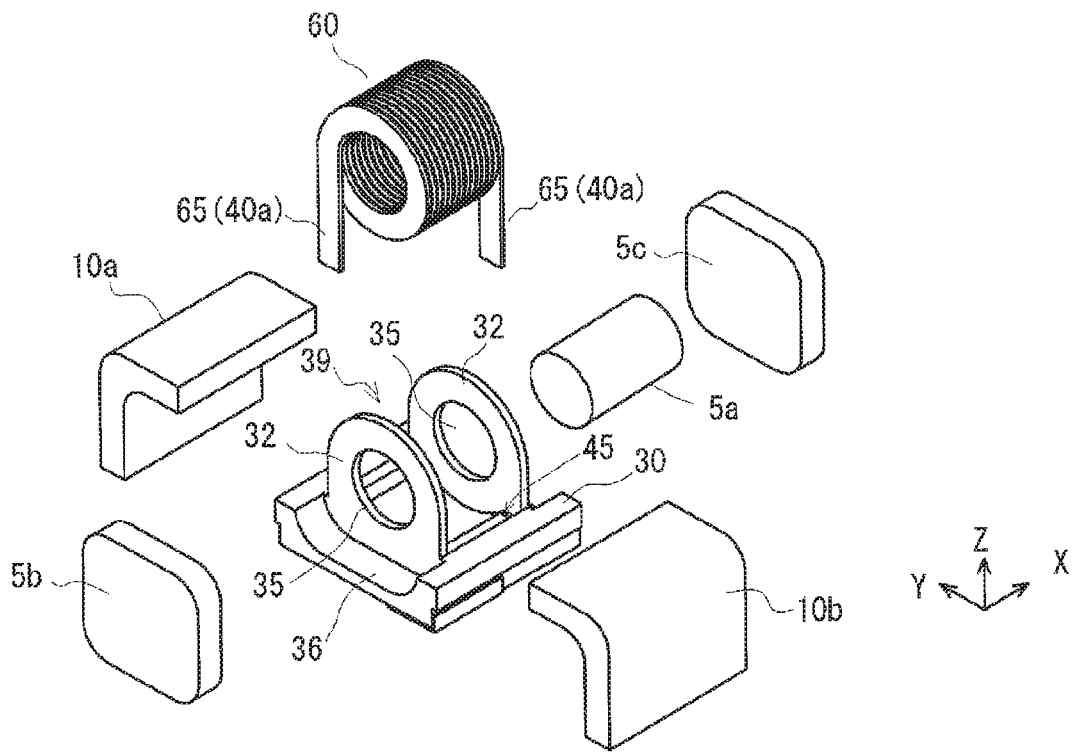
FIG. 5 is an exploded perspective view of the surface mountable reactor according to an embodiment of the invention.

Embodiments of the invention will be described with reference to the drawings. It will be understood that the embodiments are not intended to limit the invention and may be supplemented and modified within the technical scope of the invention. FIG. 1 is a perspective view of a surface mountable reactor according to an embodiment of the invention, FIG. 2 is a front view thereof, FIG. 3 is a side view thereof, FIG. 4 is a bottom view thereof, and FIG. 5 is an exploded view thereof.

The surface mountable reactor 1 of the invention has a hexahedral structure including a coil 60, a first magnetic core 5, a second magnetic core 10, and a resin mount 30, in which the first magnetic core 5 forms two of the six faces, components 10a and 10b of the second magnetic core 10 form three of them, and the resin mount 30 forms the remaining one face and is provided parallel to the winding axis of the coil 60. The surface mountable reactor 1 is so designed that when provided with mount terminals it can be surface-mounted on a limited region of a circuit board. In addition, the coil 60 is housed in the space surrounded by the flange portions 5b and 5c of the first magnetic core 5, the second magnetic core 10, and the resin mount 30, so that the electrical insulation of the coil 60 is ensured. In the invention, therefore, the second magnetic core 10 and the resin mount 30 are arranged outside the coil 60, and the second magnetic core 10 and the resin mount 30 surround the circumference of the coil 60.

The first magnetic core 5 includes an axial portion 5a, around which the coil 60 is disposed, and flange portions 5b and 5c, in which the flange portions 5b and 5c are located at both ends of the axial portion 5a to allow the coil 60 to be placed between them, and each have a square-shaped periphery that is expanded in the radial direction of the axial portion 5a to be larger than the outer diameter of the coil. The axial portion 5a and the flange portions 5b and 5c may be formed integrally. In view of ease of placement of the coil 60, however, at least one of the flange portions 5b and 5c is preferably formed separately from the other components. When provided at the ends of axial portion 5a, the flange portions 5b and 5c form two opposed faces of the hexahedral structure. In this case, the term "square-shaped" refers to a square shape having, for example, four flat sides and arc corners that are located at the corners to continuously connect the four flat sides. In other words, in the invention, the flange portions 5b and 5c of the first magnetic core 5 are each preferably a plate-shaped member having, at the periphery, two parallel sides and other sides linked thereto. In this regard, the square shape is intended to include modified versions of simple square shapes, such as shapes with their sides partially dented or protruded, as long as such shapes do not interfere with the joining with the second magnetic core 10.

The second magnetic core 10 is provided to surround the coil 60, connect the flange portions 5b and 5c of the first magnetic core 5, and cover the three sides of the periphery of the square shape so that the second magnetic core 10 forms three faces between the opposed two faces of the hexahedral structure. For example, the shape of the second magnetic core 10 is such that it has an alphabet U-shaped cross-section in the Y direction (the direction perpendicular to the winding axis direction of the coil 60) in FIG. 1. Components with an L-shaped cross-section may be assembled to form the U-shape. The second magnetic core 10 is brought into contact with the periphery of the flange portions 5b and 5c of the first magnetic core 5 to form a closed magnetic circuit. The coil 60—facing surface of the second magnetic core 10 is the contact surface with the periphery of the flange portions 5b and 5c of the first magnetic core 5. Therefore, the area of the contact surface can be easily selected according to the thickness and length of the periphery of the flange portions 5b and 5c of the first magnetic core 5. The area of the contact surface may be set larger than the cross-sectional area of the axial portion 5 of the first magnetic core 5 around which the coil 60 is disposed. In this case, a reduction in inductance value can be suppressed even when a reduction in the contact surface area occurs due to positional displacement between the components assembled. The X-directional length of the second magnetic core 10 maybe the same as the X-directional length of the first magnetic core 5. However, the X-directional length of the second magnetic core 10 may be set longer than the X-direction length of the first magnetic core 5 so that a reduction in the contact surface area can be prevented even when positional displacement occurs in the X direction.

In the embodiment shown in the drawings, the second magnetic core 10 is composed of two L-shaped components 10a and 10b, which are so assembled that the first magnetic core 5 is sandwiched in the Y direction between them. In other words, in the invention, the second magnetic core 10 is composed of a plurality of components 10a and 10b separable toward outside the coil 60. The L-shaped components 10a and 10b are brought into contact with the flat two sides of the peripheries of the flange portions 5b and 5c of the first magnetic core 5, respectively, in which one of the two sides is the contact surface common to the two L-shaped components 10a and 10b, so that the second magnetic core 10 is brought into contact with the three sides of each of the flange portions 5b and 5c of the first magnetic core 5. The structure composed of the L-shaped components 10a and 10b can be easily assembled with the flange portions 5b and 5c of the first magnetic core 5.

Specifically, this embodiment has the following features. The flange portions 5b and 5c of the first magnetic core 5 are each a plate-shaped member having, at the periphery, two parallel sides and other sides linked thereto. One component 10a of the second magnetic core 10 has a cross-section including: an inner linear portion along one of the two parallel sides; and an inner curved portion along one of the other sides, in which the cross-section is perpendicular to the winding axis direction of the coil 60. The other component 10b has a cross-section including: an inner linear portion along the other of the two parallel sides; and an inner curved portion along one of the other sides, in which the cross-section is perpendicular to the winding axis direction of the coil 60, and the components 10a and 10b are assembled to form the second magnetic core 10.

According to these features, the components 10a and 10b can be assembled in advance to form the second magnetic core 10, into which the first magnetic core 5 can be easily inserted, so that the periphery of each of the flange portions 5b and 5c can be accurately brought into close contact with the inner surface of the second magnetic core 10.

The first and second magnetic cores 5 and 10 include a magnetic material such as a magnetic metal material or soft ferrite. A dust core including magnetic metal material particles with a high saturation magnetic flux density bonded with an insulating resin is advantageously used to form a compact magnetic core for use in a reactor. However, such a dust core has a higher core loss and a lower magnetic permeability than a soft ferrite magnetic core. In addition, such a dust core needs to be formed at high pressure and is difficult to form in a complicated shape due to a problem such as mold damage. If such a dust core is formed at low pressure, its density will not increase and it can have a further reduced magnetic permeability. In such a case, the number of turns in the coil has to be increased in order to achieve the desired inductance value, so that the formation of a compact magnetic core may fail to lead to the formation of a compact reactor.

On the other hand, soft ferrite has a relatively low saturation magnetic flux density and a Curie temperature lower than that of magnetic metal materials, and decreases in saturation magnetic flux density with increasing temperature. Therefore, soft ferrite magnetic cores have to be so designed that they have a large magnetic path's cross-section for the prevention of magnetic saturation, and thus inevitably tend to have a large shape. In order to downsize the surface mountable reactor 1, therefore, it is preferable that a dust core including a magnetic metal material with a high saturation magnetic flux density should be used to form the first magnetic core 5, around which the coil 60 will be disposed so that the magnetic flux will concentrate, while a ferrite magnetic core including soft ferrite with a high magnetic permeability and a low core loss should be used to form the second magnetic core 10.

The resin mount 30 has a pair of wall portions 32 that are provided in a region inside the outer edges and so located that the coil 60 can be placed between them. The resin mount 30 also has holes 45 that are formed between the wall portions 32 to allow the end portions of the coil 60 to pass through them. The resin mount 30 also has recesses 36 that are formed outside the wall portions 32 as illustrated to fix the positions of the flange portions 5b and 5c of the first magnetic core 5. In this embodiment, therefore, the resin mount 30 has a pair of wall portions 32 that are so located along the winding axis direction of the coil 60 that the coil 60 can be placed between them; magnetic core receiving portions (recesses 36) provided outside the wall portions 32; and a coil receiving portion provided between the wall portions 32. The positions of the flange portions 5b and 5c of the first magnetic core 5 are fixed at the recesses 36 of the resin mount 30, and the second magnetic core 10 is disposed on the fixed flange portions 5b and. 5c. The flange portions 5b and 5c of the first magnetic core 5 and the second magnetic core 10 can be accurately assembled relative to the resin mount 30, which makes it possible to reduce a displacement-induced decrease or variation in inductance.

Figure 16:
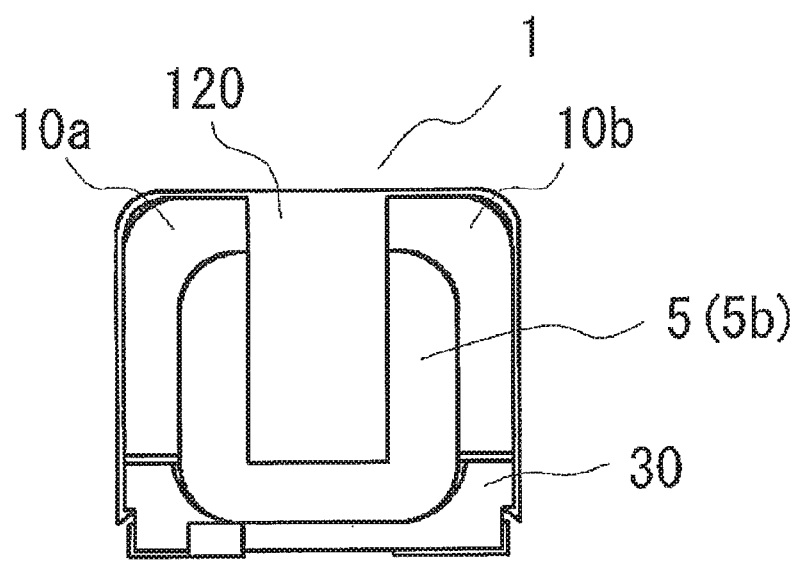
FIG. 16 is a front view of a surface mountable reactor according to another embodiment of the invention.

In the surface mountable reactor 1, the L-shaped components 10a and 10b are assembled to form the second magnetic core 10. On the top side of the surface mountable reactor 1, therefore, the second magnetic core 10 is divided into the components and has a stripe-shaped gap 50 formed along the winding axis direction of the coil (the X direction). In some cases, the surface mountable reactor 1 is surface-mounted with its top surface being sucked. In order to prevent the air leakage, therefore, a sealing member 100 for closing at least part of the gap 50 is preferably attached to the reactor 1, or as shown in FIG. 16, the reactor 1 is preferably covered with a cap-shaped cover member 120. The cover member 120 may be made of any material having spring properties. Preferably, the cover member 120 is made of an insulating material because it is close to mount terminals 40. Preferably, the cover member 120 has extension portions extending from the top of the surface mountable reactor 1 to the respective sides so that the flange portions 5b and 5c of the first magnetic core 5, the second magnetic core 10, and the resin mount 30 are held between the extension portions. The cover member 120 may be bonded and fixed to the resin mount 30, or the ends of the extension portions may be provided with hooks which may be engaged with steps or other portions formed in the resin mount 30 so that the cover member 120 can be fixed on the resin mount 30. According to these features, a plurality of components of the surface mountable reactor 1 are held by the cover member 120 and prevented from separating and dropping easily due to an external force.

Each end portion 65 of the coil 60 disposed between the pair of wall portions 32 of the resin mount 30 is extended through the hole 45 of the resin mount 30 to the lower side, extended along the bottom surface to the side surface, and bent to the side surface to form a mount terminal 40a. In this embodiment, therefore, both end portions 65 of the coil 60 are extended to the outside of the resin mount 30 and then bent in opposite directions toward outside the resin mount 30 along the winding axis direction of the coil 60 to form mount terminals 40a, so that the end portions 65 of the coil 60 are disposed outside the resin mount 30. The two mount terminals 40a may be located in a 180-degree rotationally symmetric manner with respect to the center of the resin mount 30. In this case, there is no need to take into account the mounting orientation, so that the number of steps for the orientation can be reduced. Mount terminals 40b for fixation on a circuit board are provided on the bottom surface of the resin mount 30. The mount terminals 40b may be soldered together with the mount terminals 40a to a circuit board, so that the fixation strength can be improved.

Figure 6:
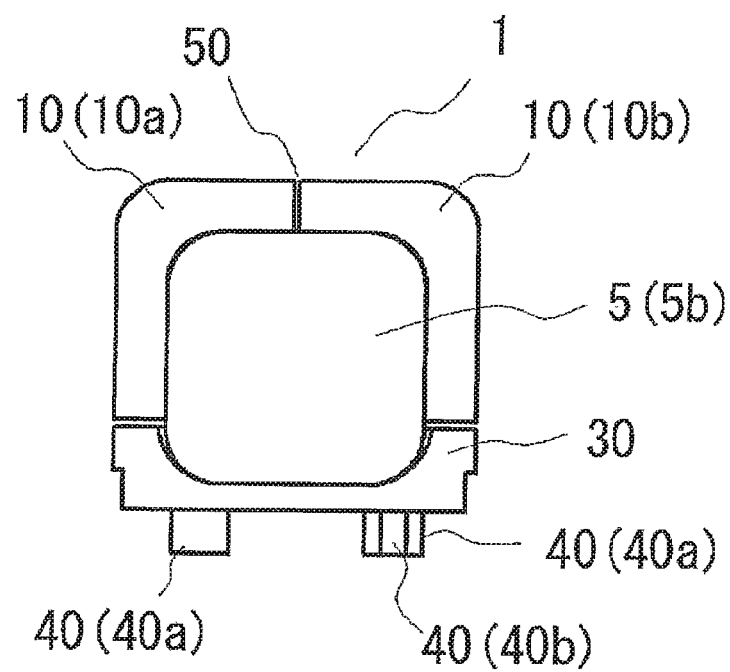
FIG. 6 is a front view of a surface mountable reactor according to another embodiment of the invention.
Figure 7:
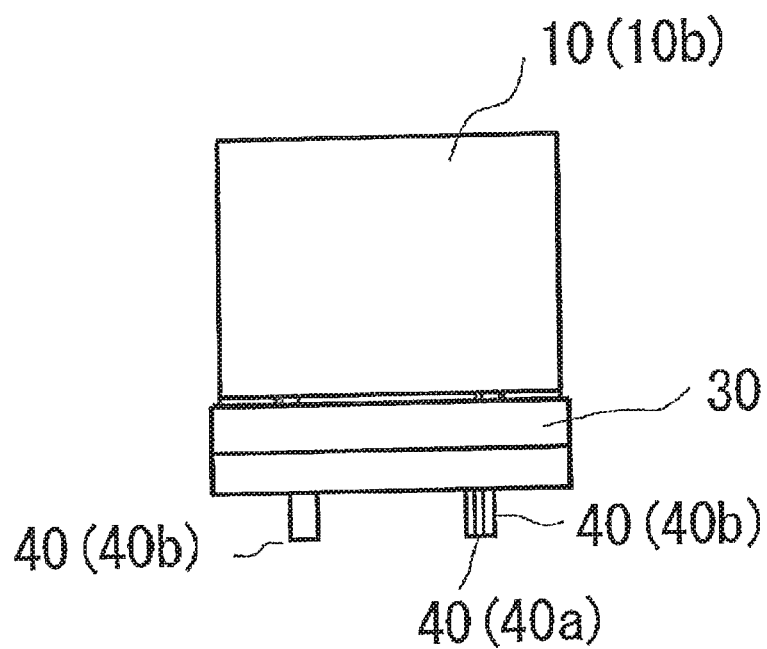
FIG. 7 is a side view of the surface mountable reactor according to another embodiment of the invention.
Figure 8:
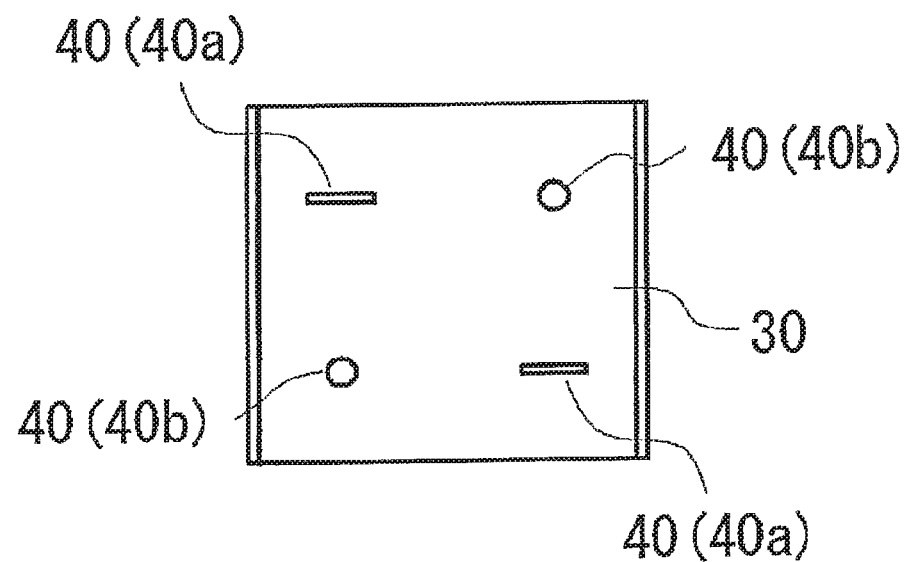
FIG. 8 is a bottom view of the surface mountable reactor according to another embodiment of the invention.

Another example of the mount terminal structure will be described. FIG. 6 is a front view showing another embodiment of the surface mountable reactor, FIG. 7 is a side view thereof, and FIG. 8 is a bottom view thereof. These drawings illustrate an example where pin-shaped mount terminals 40 are formed. In the illustrated example, the end portions 65 of the coil 60 are used as mount terminals 40a without being bent, and mount terminals 40b for fixation on a circuit board are also pin-shaped. The mount terminals 40 (40a, 40b) can be inserted into through holes provided in a circuit board, and fixed by soldering, which makes it possible to further improve the fixation strength.

Figure 9:
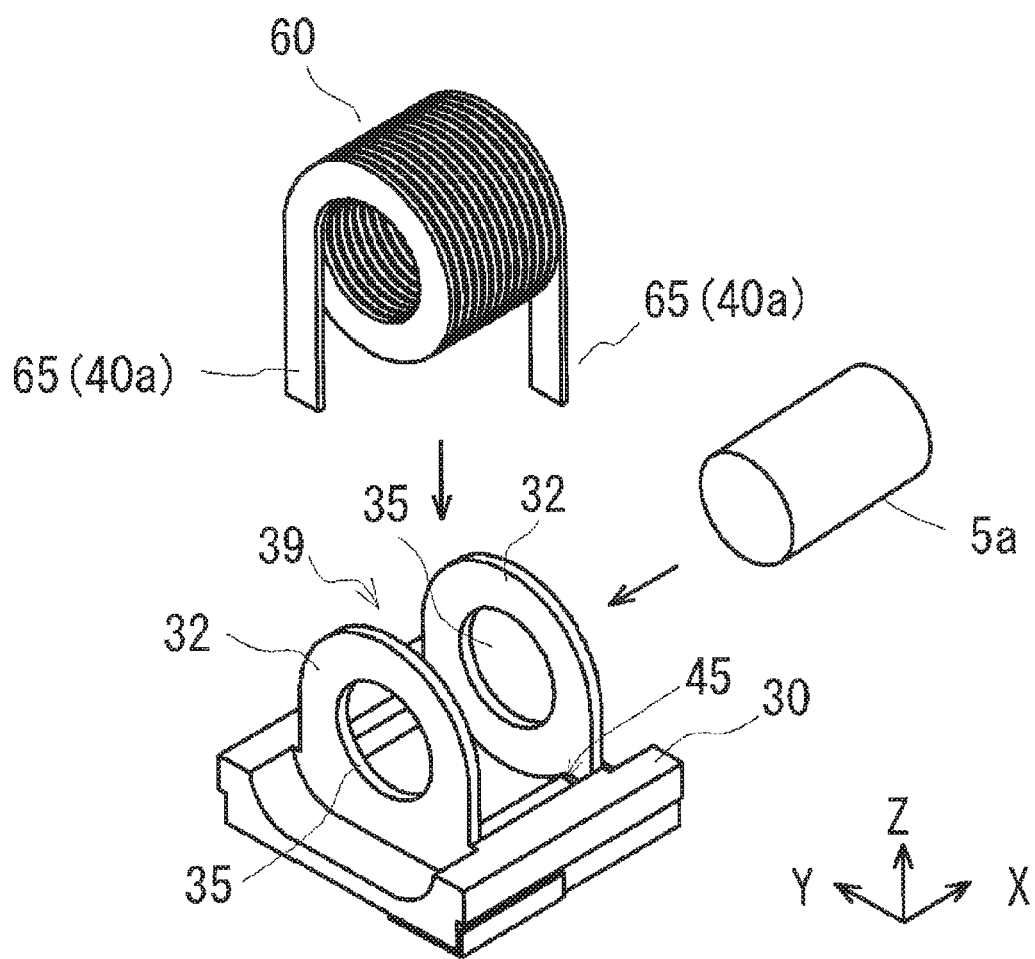
FIG. 9 is a view for illustrating the fabrication of the surface mountable reactor according to an embodiment of the invention.
Figure 10:
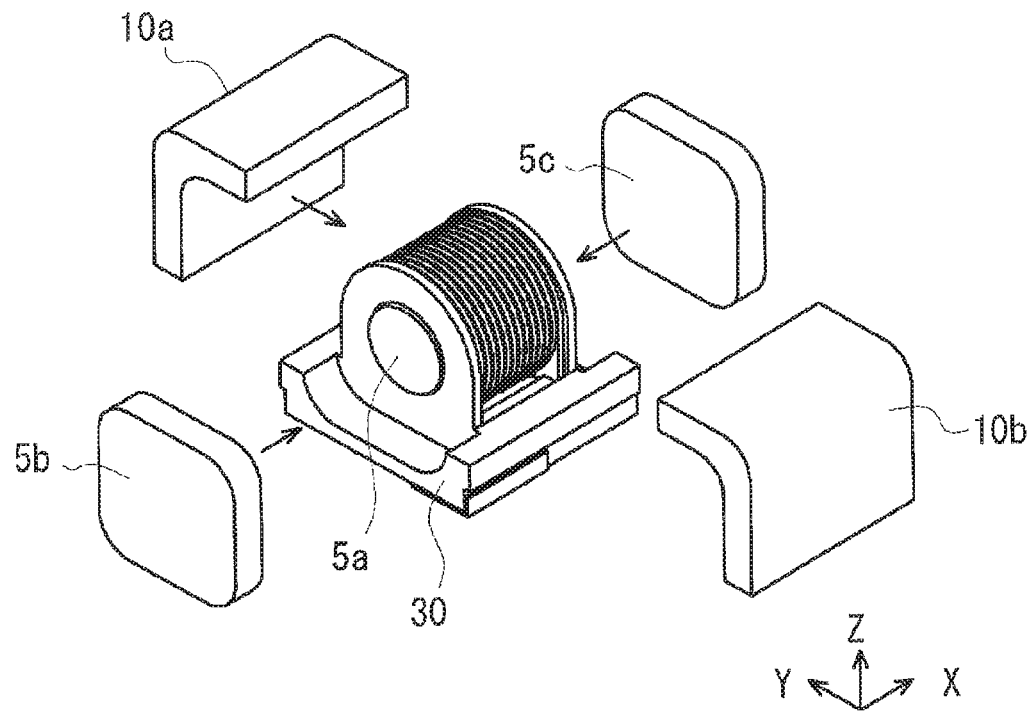
FIG. 10 is a view for illustrating the fabrication of the surface mountable reactor according to an embodiment of the invention.
Figure 11:
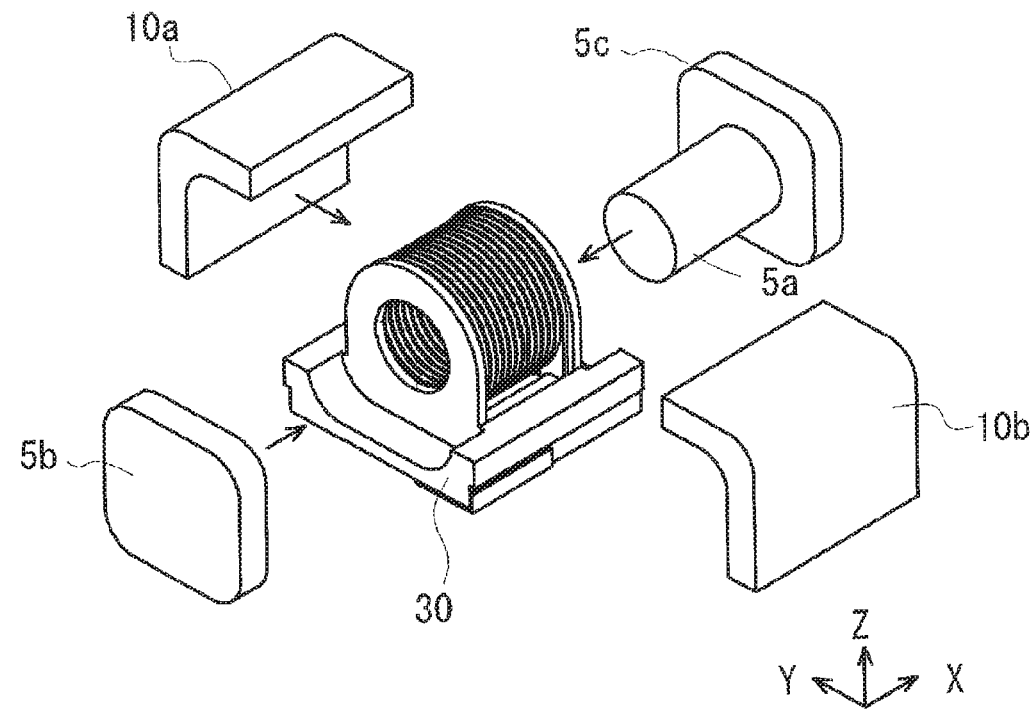
FIG. 11 is a view for illustrating the fabrication of a surface mountable reactor according to another embodiment of the invention.
Figure 12:
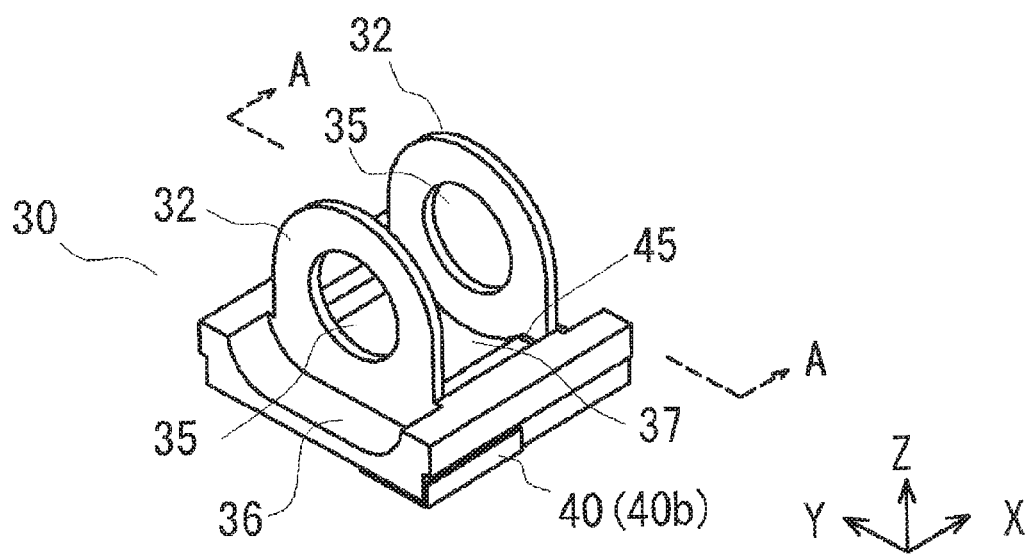
FIG. 12 is a perspective view of a resin mount for use in the surface mountable reactor according to an embodiment of the invention.
Figure 13:
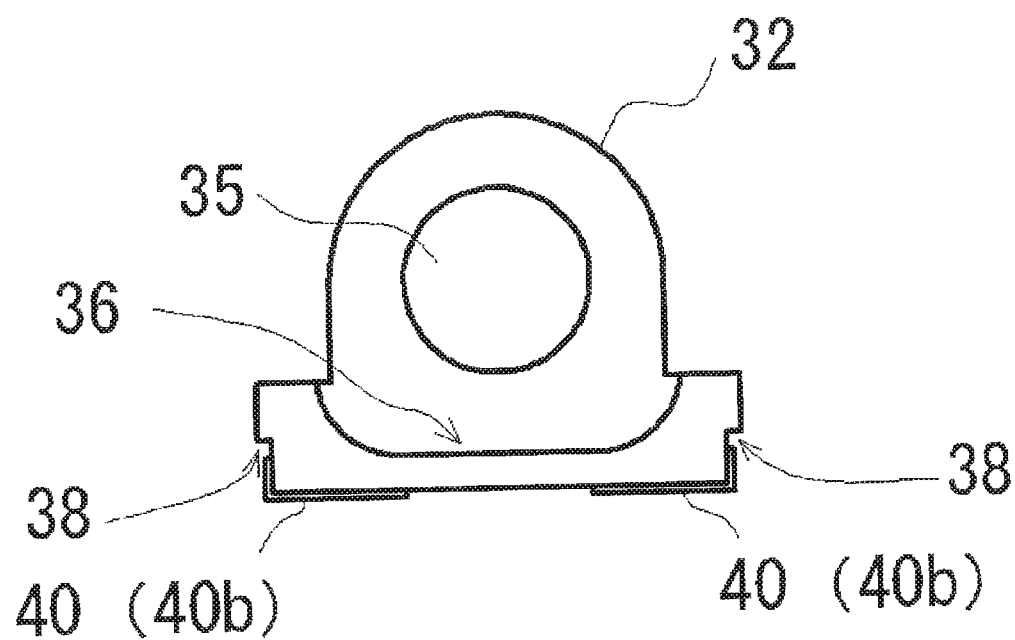
FIG. 13 is a front view of the resin mount for use in the surface mountable reactor according to an embodiment of the invention.
Figure 14:
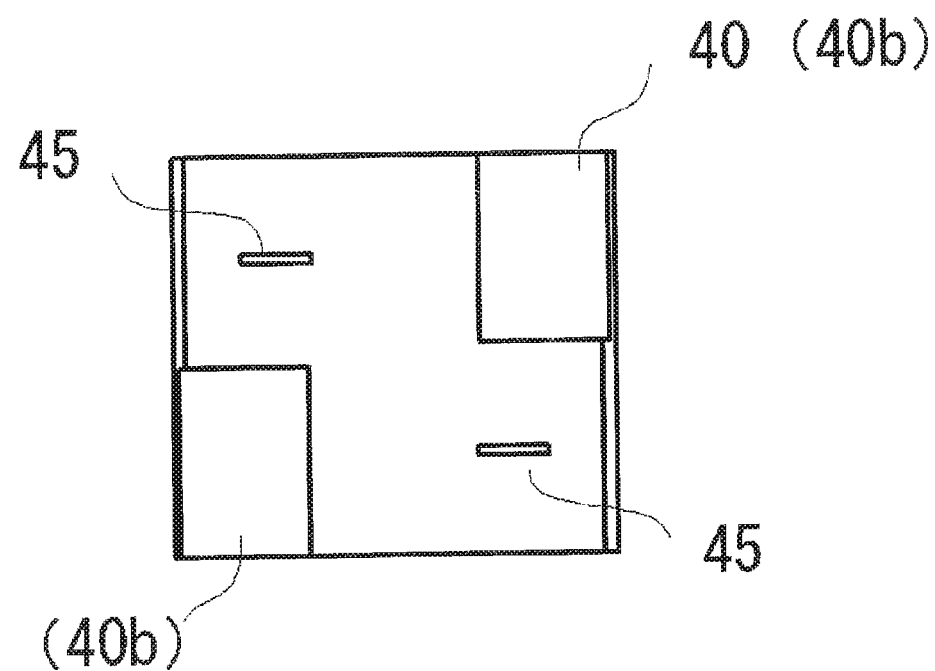
FIG. 14 is a bottom view of the resin mount for use in the surface mountable reactor according to an embodiment of the invention.
Figure 15:
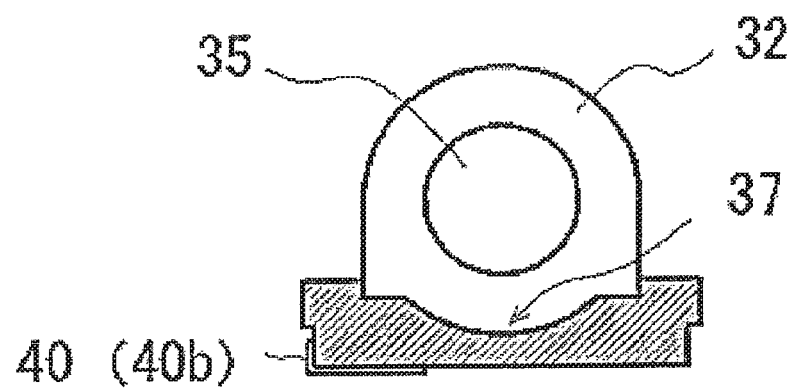
FIG. 15 is a cross-sectional view of the resin mount along the arrow A-A line in FIG. 12 for use in the surface mountable reactor according to an embodiment of the invention.

Hereinafter, components used to form the surface mountable reactor will be described, and the fabrication of the surface mountable reactor using these components and other components will be described. Note that a repeated description of the same components will be omitted in some cases. FIGS. 9 and 10 are views for illustrating the fabrication of a surface mountable reactor according to an embodiment of the invention, and FIG. 11 is a view for illustrating the fabrication of a surface mountable reactor according to another embodiment of the invention. FIG. 12 is a perspective view of a resin mount for use in a surface mountable reactor according to an embodiment of the invention, FIG. 13 is a front view thereof, FIG. 14 is a bottom view thereof, and FIG. 15 is a cross-sectional view taken along the arrow A-A line in FIG. 12.

(First magnetic core)

The first magnetic core 5 includes an axial portion 5a and square-shaped flange portions 5b and 5c located at both ends of the axial portion 5a. In the example shown in FIGS. 9 and 10, the first magnetic core 5 includes three separate components: a cylindrical axial portion 5a and square plate-shaped flange portions 5b and 5c. This feature allows each component to have a simple shape and thus makes it easy to form a dust core using a magnetic metal material. In another mode, as shown in FIG. 11, a member including an axial portion 5a and a flange portion 5c integrated together and having an. XZ cross-section in the form of an alphabet T, which appears by cutting perpendicular to the Y direction, may be used to form the first magnetic core 5.

A dust core for use in forming the first magnetic core can be produced, for example, by a process including: mixing, with silicone resin and other materials, a magnetic metal material having an insulating film formed on the surface; subjecting the mixture to compression molding; and then subjecting the molded product to an anneal heat treatment to remove the residual stress. The magnetic metal material to be used may be an Fe-based amorphous alloy ribbon, an Fe-based nanocrystalline alloy ribbon, pure Fe, or a powder of an Fe-based soft magnetic material such as an Fe—Si, Fe—Ni, Fe—Al, Fe—Co, Fe—Cr, or Fe—Si—M alloy (M is Cr or Al). Preferably, at 23° C., the magnetic metal material should have a saturation magnetic flux density Bs of 800 mT or more, and a dust core made from the magnetic metal material should have an initial magnetic permeability μi of 40 or more at a frequency of 100 kHz and preferably has a core loss of 250 kW/m$^3$ or less at a frequency of 20 kHz and a maximum magnetic flux density of 150 mT.

(Second magnetic core)

The second magnetic core 10 includes two components 10a and 10b each having an L-shaped cross-section. The illustrated L-shaped components 10a and 10b may be dust cores made from a magnetic metal material similarly to the first magnetic core 5. For the reason mentioned above, however, a soft ferrite material, in particular, a Mn-based ferrite material with a high saturation magnetic flux density Bs is preferably used to form the L-shaped components 10a and 10b. In some cases, the surface mountable reactance is exposed to an environment at more than 100° C. due to heat generation from the coil or the operating environment. As compared with magnetic metal materials, soft ferrite materials have low Curie temperatures and large temperature dependence of saturation magnetic flux density. Therefore, in order to downsize the surface mountable reactor and to prevent thermal runaway in a high-temperature environment, the second magnetic core 10 should preferably include a Mn-based ferrite material, in particular, a Mn-based soft ferrite material that exhibits a minimum core loss (one magnetic characteristic) at a temperature of 100° C. or more and has a saturation magnetic flux density of 380 mT or more at 130° C. Preferably, the ferrite material should have a saturation magnetic flux density of 500 mT or more at 23° C., an initial magnetic permeability of 1,500 or more at a frequency of 100 kHz, a core loss of 800 kW/m$^3$ or less at a frequency of 100 kHz and at a maximum magnetic flux density of 200 mT, and a saturation magnetic flux density of 400 mT or more at 130° C.

(Coil)

The coil 60 is formed by winding a conductor wire (e.g., an enameled wire including a copper wire covered with polyamide imide). The conductor wire used to form the coil 60 may have any of various cross-sectional shapes such as a circle and a rectangle. The space factor of the coil can be increased using a conductor wire having a rectangular cross-section with a ratio of width to thickness of 5 or more (a flat wire). In the illustrated example, an edgewise coil is used, which is formed by edgewise winding of a flat wire. The number of turns in the coil 60 is appropriately selected on the basis of the desired inductance value, and the wire diameter is appropriately selected on the basis of the current level to be applied.

(Resin mount)

An embodiment of the resin mount 30 is shown in FIGS. 12 to 15. The resin mount 30 may be made of any material with satisfactory insulating performance. For example, the resin mount 30 can be obtained by subjecting a resin, such as polyethylene terephthalate (PET), polybutylene terephthalate (PBT), polyphenylene sulfide (PPS), or a liquid crystal polymer, to a known molding process such as injection molding. As to the insulating performance, the resin mount 30 preferably has a breakdown voltage of 3 kV/mm or more, more preferably 10 kV/mm or more.

Mount terminals 40b are provided on the bottom surface of the resin mount 30 by insert molding. The mount terminals 40b are formed with an area larger than that of the mount terminals 40a formed of the end portions 65 of the coil 60, so that the mount terminals 40b can increase the strength of connection to the circuit board. Steps 38 are also formed at the sides of the resin mount 30, and the mount terminals 40b partially appear at the steps 38, which makes it easy to check fillet formation during soldering to the circuit board.

An opening 35, through which the axial portion 5a of the first magnetic core 5 is to be passed, is formed in each plate-shaped wall portion 32 of the resin mount 30. The openings 35 are formed with such a size that the axial portion 5a of the first magnetic core 5 is insertable into them. The openings 35 are so formed that both ends of the axial portion 5a are supported by the wall portions 32. In the region 39 between the wall portions 32, an arc-shaped recess portion 37 is formed to face the bottom of the coil 60 and to prevent interference with the coil 60. When the resin mount 30 is partially recessed, the surface mountable reactor can be formed with a reduced height while the strength of the resin mount 30 is kept high enough.

(Fabrication of surface mountable reactor)

The surface mountable reactor of this embodiment can be fabricated, for example, through the process described below. The fabrication will be described with reference to FIGS. 9 and 10.

As shown in FIG. 9, the coil 60 is disposed in the region 39 between the pair of wall portions 32 of the resin mount 30. The coil 60 is disposed with the center of its air core substantially aligned with the center of the opening 35 of each wall portion 32. The extension portions of the coil 60 are inserted into the holes 45 of the resin mount 30 and extended to the bottom side of the resin mount 30. The side of the coil 60 is preferably bonded to a certain region of the resin mount 30, such as the region 37.

Subsequently, the axial portion 5a of the first magnetic core 5 is inserted into the air core of the coil 60 substantially concentrically aligned with the opening 35. The flange portions 5b and 5c of the first magnetic core 5 are disposed in the recesses 36 of the resin mount 30 with the coil 60 placed between them in the winding axis direction and then bonded to both sides of the axial portion 5a. The L-shaped components 10a and 10b of the second magnetic core are further bonded and fixed to the periphery of the flange portions 5b and 5c of the first magnetic core 5, so that the first magnetic core 5, the second magnetic core 10, the coil 60, and the resin mount 30 are integrated. The mount terminals 40a are formed by bending, along the bottom surface, the end portions 65 of the coil 60, which appear on the bottom surface of the resin mount 30, further extending the end portions 65 to the side surface, then folding the end portions 65 along the side surface of the resin mount 30, and then cutting off the unnecessary parts of the end portions 65, so that the surface mountable reactor 1 is completed.

(Surface mountable reactor according to another embodiment)

Figure 21:
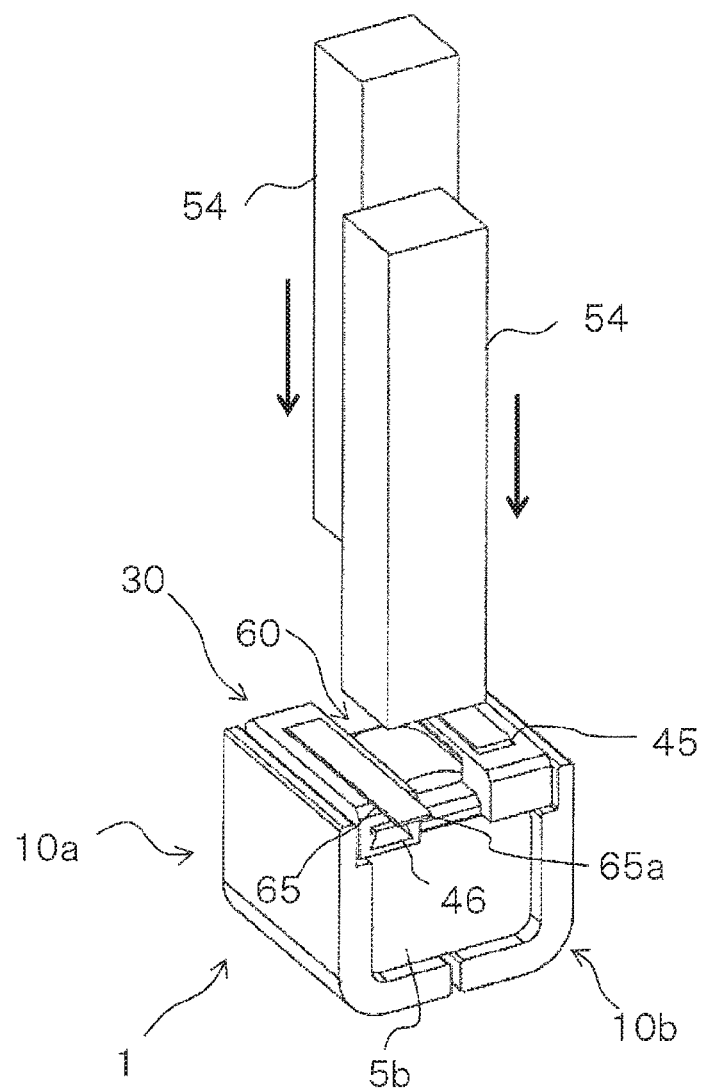
FIG. 21 is a view for illustrating the fabrication of the surface mountable reactor according to another embodiment of the invention.
Figure 22:
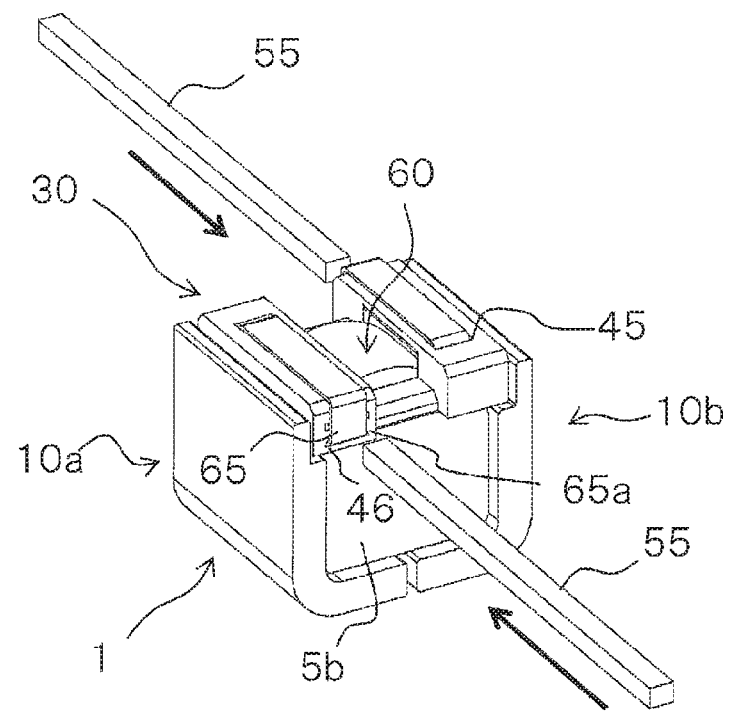
FIG. 22 is a view for illustrating the fabrication of a surface mountable reactor according to another embodiment of the invention.
Figure 23:
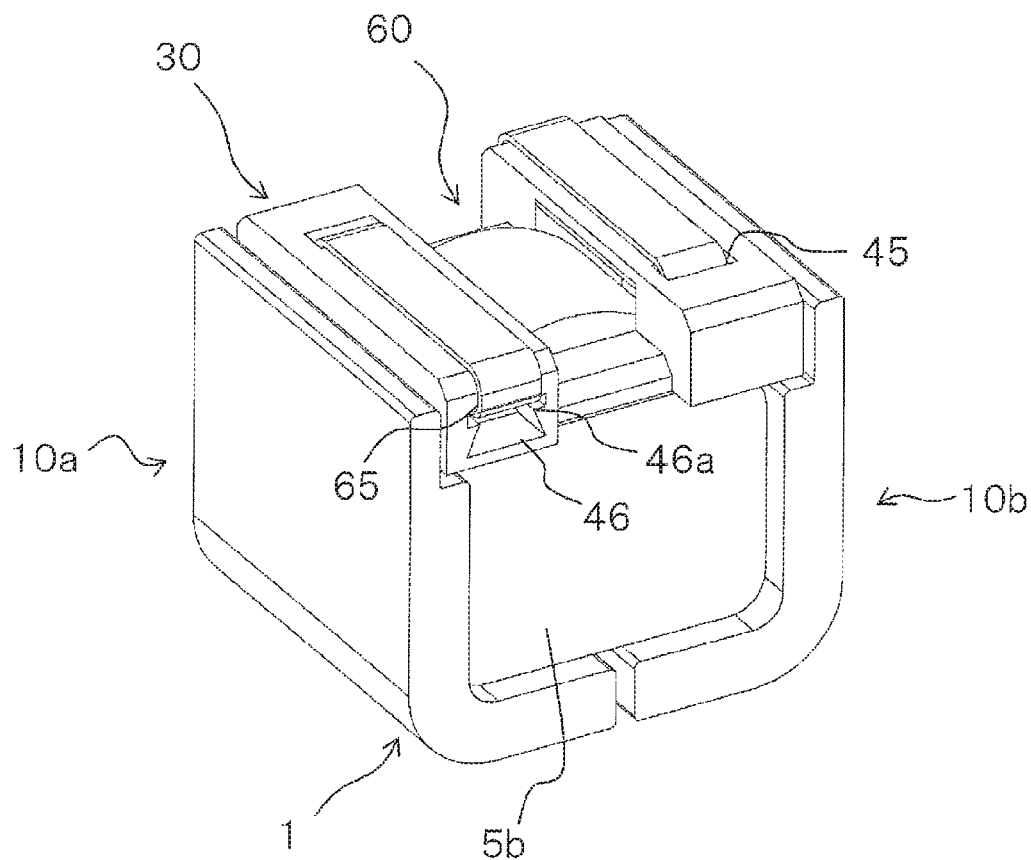
FIG. 23 is a perspective view of a surface mountable reactor according to another embodiment of the invention.

FIGS. 18 to 22 are views for illustrating the fabrication of a surface mountable reactor according to another embodiment of the invention, and FIG. 23 is a perspective view of the resulting surface mountable reactor according to the embodiment.

Figure 18:
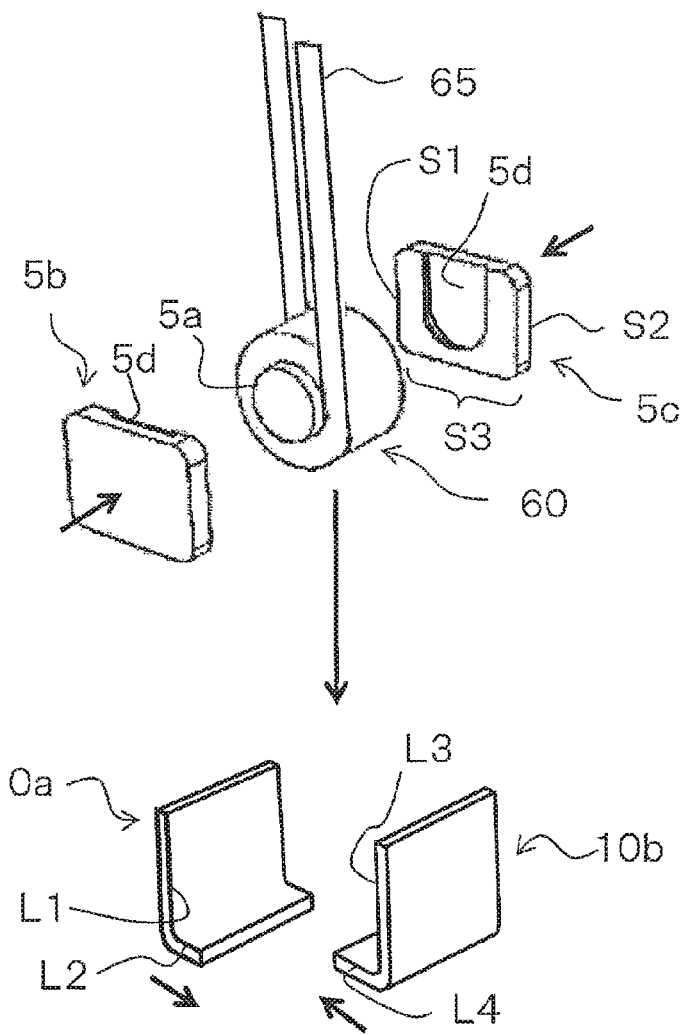
FIG. 18 is a view for illustrating the fabrication of a surface mountable reactor according to another embodiment of the invention.

The embodiment described above shows an example where the coil 60 is disposed in the region 39 between the pair of wall portions 32 of the resin mount 30 and the axial portion 5a of the first magnetic core 5 is passed though the opening 35 of each wall portion 32 and inserted in the air core of the coil 60. Alternatively, as shown in FIG. 18, the coil 60 may be disposed around the axial portion 5a, and then the first magnetic core 5 having the flange portions 5b and 5c disposed in place may be assembled with a plurality of components 10a and 10b that are separable toward outside the coil 60 and arranged to form the second magnetic core 10.

In this case, the first magnetic core 5 used includes an axial portion 5a, around which the coil 60 is disposed, and plate-shaped flange portions 5b and 5c, in which the flange portions 5b and 5c each have, at the periphery, two parallel sides S1 and S2 and other sides S3 linked thereto, and the second magnetic core 10 used includes components 10a and 10b, in which one component 10a has a cross-section including: an inner linear portion L1 along one side S1 of the two parallel sides; and an inner curved portion L2 along one side S3 of the other sides, the cross-section is perpendicular to the winding axis direction of the coil 60, the other component 10b has a cross-section including: an inner linear portion L3 along the other side S2 of the two parallel sides; and an inner curved portion L4 along one side S3 of the other sides, and the cross-section is perpendicular to the winding axis direction of the coil 60. In this case, the first magnetic core 5 includes a component serving as the axial portion 5a and components serving as the flange portions 5b and 5c, and the components serving as the flange portions 5b and 5c each preferably have a recess 5d in which the end of the component serving as the axial portion 5a is to be engaged.

Using one component 10a and the other component 10b with such features, a first step is performed, including assembling one component 10a and the other component 10b in such a manner that the peripheral surface of the flange portions 5b and. 5c of the first magnetic core 5 is brought into contact with the coil 60—facing inner surface of the second magnetic core 10. The first step preferably includes holding the components 10a and 10b on a holder with an adhesive or the like applied in advance to the faces of the components 10a. and 10b butted against each other; inserting, between the components 10a and 10b, the first magnetic core 5 around which the coil 60 is disposed; and pressurizing both components 10a and 10b from the outside to bond them.

Figure 19:
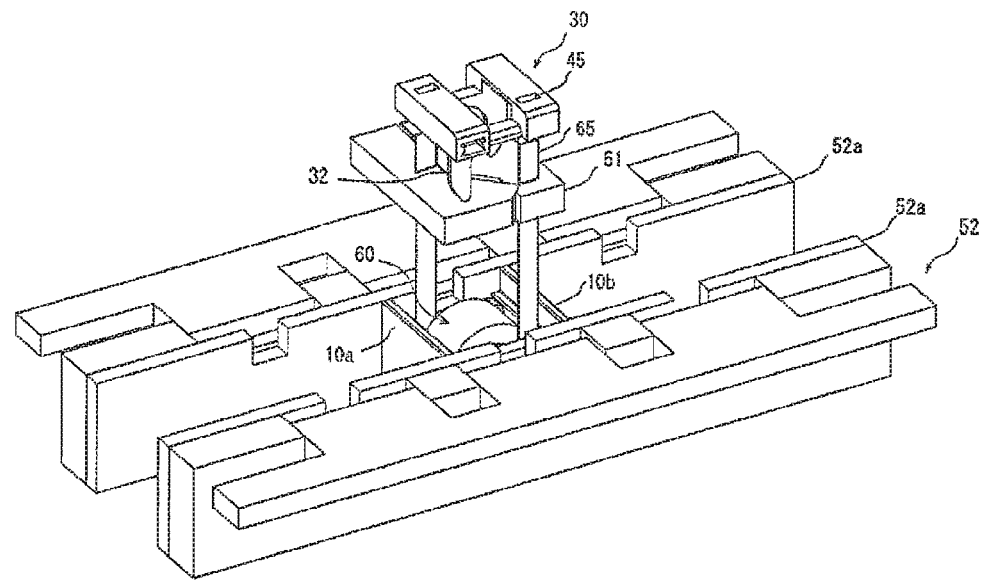
FIG. 19 is a view for illustrating the fabrication of the surface mountable reactor according to another embodiment of the invention.

Subsequently, as shown in FIG. 19, a second step is performed, including providing a resin mount 30 having holes 45 into which the end portions 65 of the coil 60 are to be inserted; and inserting the end portions 65 of the coil 60 into the holes 45 of the resin mount 30. Prior to this step, a resin is preferably introduced into the space defined by the first magnetic core 5 and the second magnetic core 10 to seal the coil 60. The resin is preferably a high thermal conductivity resin such as a silicone resin.

The second step includes, for example, catching and holding the components 10a and 10b of the second magnetic core 10 between the holding plates 52a of a holding device 52; holding and aligning the end portions 65 of the coil 60 with a chucking device 51; and then lowering the resin mount 30 so that the end portions 65 are inserted from their front end into the holes 45. Subsequently, after the chucking device 51 is detached, the resin mount 30 is inserted between the components 10a and 10b by being further lowered.

The resin mount 30 to be used may have a pair of wall portions 32 that are located to allow the coil 60 to be placed between them in the winding axis direction of the coil 60.

After the resin mount 30 is disposed, a resin may be introduced into the interior of the resin mount 30, and the resin mount 30 may have an opening for the introduction of the resin. When a thermosetting resin is used, the thermosetting resin should preferably be introduced into the interior of the resin mount 30 and then cured by heating.

Figure 20:
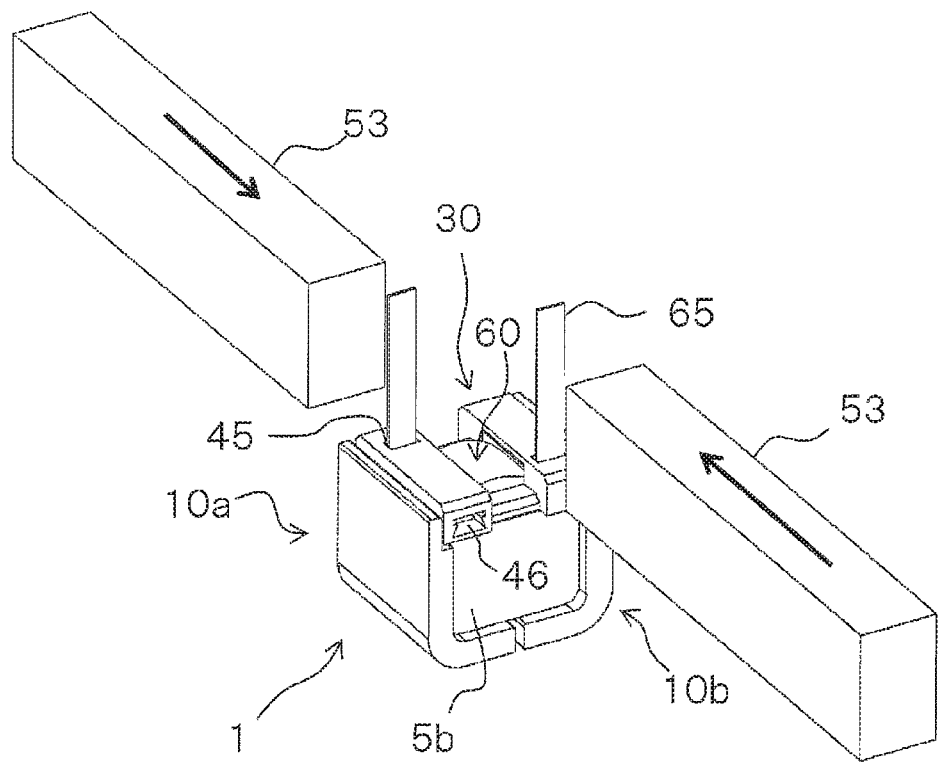
FIG. 20 is a view for illustrating the fabrication of the surface mountable reactor according to another embodiment of the invention.

Subsequently, as shown in FIG. 20, a third step is performed, in which both end portions 65 of the coil 60, which protrude out of the resin mount 30, are bent in opposite directions from the protruding parts of the end portions 65 to the inner part (or outer part) of the resin mount 30 along the winding axis direction of the coil 60, so that mount terminals 40a are formed. Prior to this step, both end portions 65 of the coil 60 are preferably cut to an appropriate length.

The third step can be performed by allowing horizontal rods 53 to slide in the directions indicated by the arrows while the surface mountable reactor 1 is fixed. In this step, both end portions 65 of the coil 60 are bent along the bottom surface of the resin mount 30.

Also in this embodiment, as shown in FIGS. 21 to 23, the resin mount 30 used may have openings 46 at the end surfaces opposed in the winding axis direction of the coil 60, and the front end 65a of each end portion 65 of the coil 60 may be inserted in each opening 46. In this case, the length of the end portions 65 is so set that the front end 6 of each end portion 65 of the coil 60 is positioned to protrude from the bottom surface of the resin mount 30 after the third step.

First, as shown in FIG. 21, a step is performed, including allowing vertical rods 54 to slide in the directions indicated by the arrows while fixing the surface mountable reactor 1, so that the front end 65a and its vicinity of each end portion 65 of the coil 60 are bent along the side surface of the resin mount 30. As a result, the front ends 65a of both end portions 65 of the coil 60 are positioned outside the openings 46 formed at the side surfaces of the resin mount 30.

Subsequently, as shown in FIG. 22, a step is performed, including allowing pusher rods 55 to slide in the directions indicated by the arrows while fixing the surface mountable reactor 1, so that the front end 65a and its vicinity of each end portion 65 of the coil 60 are bent inside the opening 46 at the side surface of the resin mount 30. As a result, the front ends 65a of both end portions 65 of the coil 60 are positioned inside the openings 46 at the side surfaces of the resin mount 30.

As shown in FIG. 23, holding protrusions 46a are preferably formed at each opening 46 of the resin mount 30, and the holding protrusions 46a are preferably formed on both sides in such a manner that they are opposed to each other on both side walls of the opening 46. In this case, the holding protrusions 46a on both sides are so designed that the shortest distance between them is shorter than the width of the end portion 65 of the coil 60.

In this case, the process of bending the front end 65a of the end portion 65 allows the end portion 65 to be deformed, to go beyond the holding protrusions 46a, to be hooked on the holding protrusions 46a, and to be fixed entirely.

EXAMPLES

Example 1

The surface mountable reactor 1 was prepared using a dust core and a ferrite magnetic core as the first and second magnetic cores, respectively. A magnetic metal material (Fe-based amorphous alloy) was used to form the dust core, and Mn—Zn ferrite was used to form the ferrite magnetic core. The structure of the reactor 1 is the same as shown in FIG. 1, and therefore, a description thereof is omitted here. The outer dimensions of the reactor 1 including the resin mount made of polyethylene terephthalate were 14 mm long, 13 mm wide, and 13 mm high. The coil used was an edgewise coil of 9 turns of a flat conductor wire with a width of 2 mm and a thickness of 0.2 mm.

A powder obtained by grinding an Fe-based amorphous alloy (2605SA1 manufactured by Metglas, Inc.) ribbon was used to form the dust core for the first magnetic core 5 (the axial portion 5a and the flange portions 5b and 5c). The powder obtained by grinding the ribbon was coated with a silicon oxide film formed by tetraethoxysilane (TEOS) treatment. A mixture of a silicone resin as a binder and the powder obtained by grinding the ribbon was charged into molds and then subjected to compression molding. The resulting molded products were annealed at 400° C., which was lower than the crystallization temperature of the Fe-based amorphous alloy, so that the axial portion 5a and the flange portions 5b and 5c for the first magnetic core 5 were obtained. The dimensions of the axial portion 5a for the first magnetic core are 5 mm outer diameter ϕ×8 mm length. The dimensions of each of the flange portions 5b and 5c are 10 mm long×10 mm wide×2 mm thick, and the corners thereof are chamfered with a radius R of 2.2 mm.

The same powder obtained by grinding the ribbon was used to form a ring-shaped dust core with an outer diameter of 14 mm, an inner diameter of 8 mm, and a height of 5 mm, on which a conductor wire was wound by 30 turns. The initial magnetic permeability of the core was measured at 23° C. and a frequency of 100 kHz using LCR Meter 4284A manufactured by Hewlett-Packard Company. In addition, a conductor wire was wound by 20 turns on each of the primary and secondary sides of the ring-shaped dust core. A sinusoidal alternating magnetic field with a maximum magnetic flux density of 150 mT and a frequency of 20 kHz was applied to the core from B-H Analyzer (SY-8232 manufactured by IWATSU TEST INSTRUMENTS CORPORATION) when the core loss Pcv was measured at 23° C. As a result, the initial magnetic permeability μi was 50, and the core loss was 200 kW/m$^3$.

Mn—Zn ferrite containing Fe, Mn, and Zn as main components and Si, Ca, Co, and Bi as subcomponents was used to form the second. magnetic core 10 (L-shaped components 10a and 10b). A granulated powder of the Mn—Zn ferrite was charged into molds and then subjected to compression molding. The resulting molded products were fired at 1,300° C. while the oxygen concentration was controlled, so that the L-shaped components 10a and 10b were obtained. The dimensions of the L-shaped components 10a and 10b are as follows: 12 mm long (X direction in FIG. 1), 9.5 mm long (outer side, Z direction in FIG. 1), 7 mm wide (outer side, Y direction in FIG. 1), 2 mm thick (in Z and Y directions). Their inner corners are chamfered with a radius R of 2 mm, and their outer corners are chamfered with a radius R of 2.8 mm.

The same Mn—Zn ferrite was used to form a ring-shaped ferrite magnetic core with an outer diameter of 25 mm, an inner diameter of 15 mm, and a height of 5 mm, on which a conductor wire was wound by 10 turns. The initial magnetic permeability μi of the core was measured at 23° C. and a frequency of 100 kHz using LCR Meter 4284A manufactured by Hewlett-Packard Company. In addition, a conductor wire was wound by 5 turns on each of the primary and secondary sides of the ring-shaped ferrite magnetic core. A sinusoidal alternating magnetic field with a maximum magnetic flux density of 200 mT and a frequency of 100 kHz was applied to the core when the core loss was measured at 23° C. to 150° C. In addition, a conductor wire was wound by 40 turns on each of the primary and secondary sides of the ferrite magnetic core, to which a 1.2 kA/m magnetic field was applied when the saturation magnetic flux density was measured at 130° C. using a DC magnetization measurement device (Model SK-110 manufactured by METRON, Inc.). As a result, the initial magnetic permeability was 2,000, the core loss was 700 kW/m$^3$ (maximum) at 23° C. and 400 kW/m$^3$ (minimum) at 130° C. in the measurement temperature range, and the saturation magnetic flux density was 400 mT at 130° C.

The resin mount 30 used was an injection-molded polyethylene terephthalate product. The resin mount 30 had wall portions 32, holes 45 into which the end portions of the coil 60 were to be inserted, recesses 36 for determining the positions of the flange portions 5b and 5c of the first magnetic core 5, and other portions. The first magnetic core 5, the second magnetic core 10, the coil 60, and the resin mount 30 were assembled by the procedure described above to form the surface mountable reactor 1. The electrical insulation was successfully enhanced by surrounding the coil 60 with the first magnetic core 5, the second magnetic core 10, and the resin mount 30. In addition, the flange portions 5b and 5c of the first magnetic core 5 and the two L-shaped components 10a and 10b of the second magnetic core 10 were assembled relative to the recesses 36 formed in the resin mount 30. This facilitated the assembling of the plural plurality of components into each magnetic core and successfully reduced the possibility of misalignment between the components.

Figure 17:
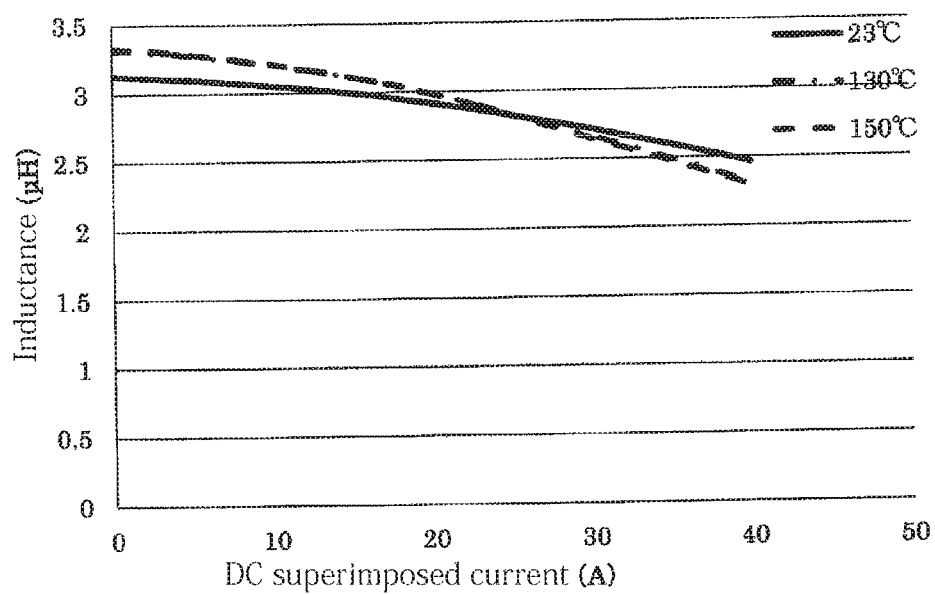
FIG. 17 is a graph showing the DC superimposition characteristics of a surface mountable reactor according to an embodiment (Example 1) of the invention.

The DC superimposition characteristics of the surface mountable reactor were evaluated by measuring the inductance L at a frequency of 50 kHz, and 23° C., 130° C., or 150° C. using LCR Meter 4284A. FIG. 17 shows the results. The DC superimposition characteristics of the surface mountable reactor of this example in the high temperature environment (130° C.), 150° bore comparison with those in the 23° C. environment, though at the high temperature, it had relatively high inductance at low superimposed current and relatedly low inductance at high superimposed current.

Example 2

The surface mountable reactor 1 with the structure shown in FIG. 23 was prepared according another embodiment (the process shown in FIGS. 18 to 22) described above using the materials, dimensions, and coil shown below. The reactor of this example was designed to have an initial inductance of 30 μH or more and an inductance of 25 μH or more at a superimposed current of 7 A. with respect to its DC superimposition characteristics.

(Materials)

The flange portions 5b and 5c of the first magnetic core 5 and the second magnetic core 10 were the same as those in Example 1. An Fe—Si—Al alloy Sendust (registered trademark) or an Fe—Ni alloy High Flux was used to form the axial portion 5a for the first magnetic core 5. Sendust has the following features: Fe7.0Si8.5Al; saturation magnetic flux density Bs=1.1 T; initial magnetic permeability μi=80. High Flux has the following features: Fe50Ni; saturation magnetic flux density Bs=1.5 T; initial magnetic permeability μi=50.

(Dimensions)

The first magnetic core 5 (axial portion 5a) was 5 mm φ×7.5 mm, the first magnetic core 5 (flange portions 5b and 5c) was 8 mm wide×10.5 mm long×2 mm thick, and its corners were chamfered with a radius R of 1.2 mm. The L-shaped components 10a and 10b for the second magnetic core 10 were 12.5 mm long, 1.25 mm wide×7 mm long (outer side), and 2 mm thick, their inner corners were chamfered with a radius R of 1 mm, and their outer corners were chamfered with a radius R of 1.5 mm.

(Coil)

The coil used was an edgewise coil of 25 turns of a flat conductor wire with a width of 2 mm and a thickness of 0.2 mm.

Figure 24:
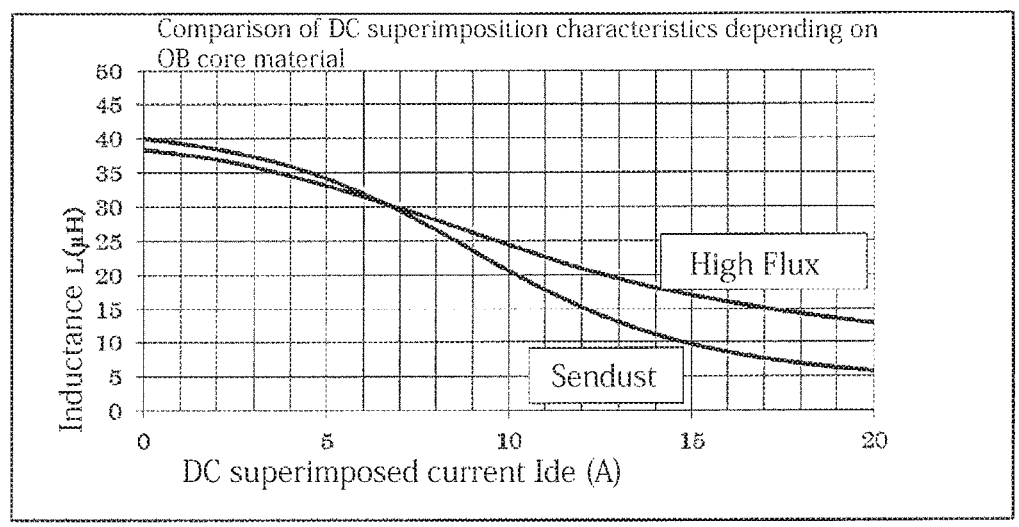
FIG. 24 is a graph showing the DC superimposition characteristics of surface mountable reactors according to another embodiment (Example 2) of the invention.
Figure 25:
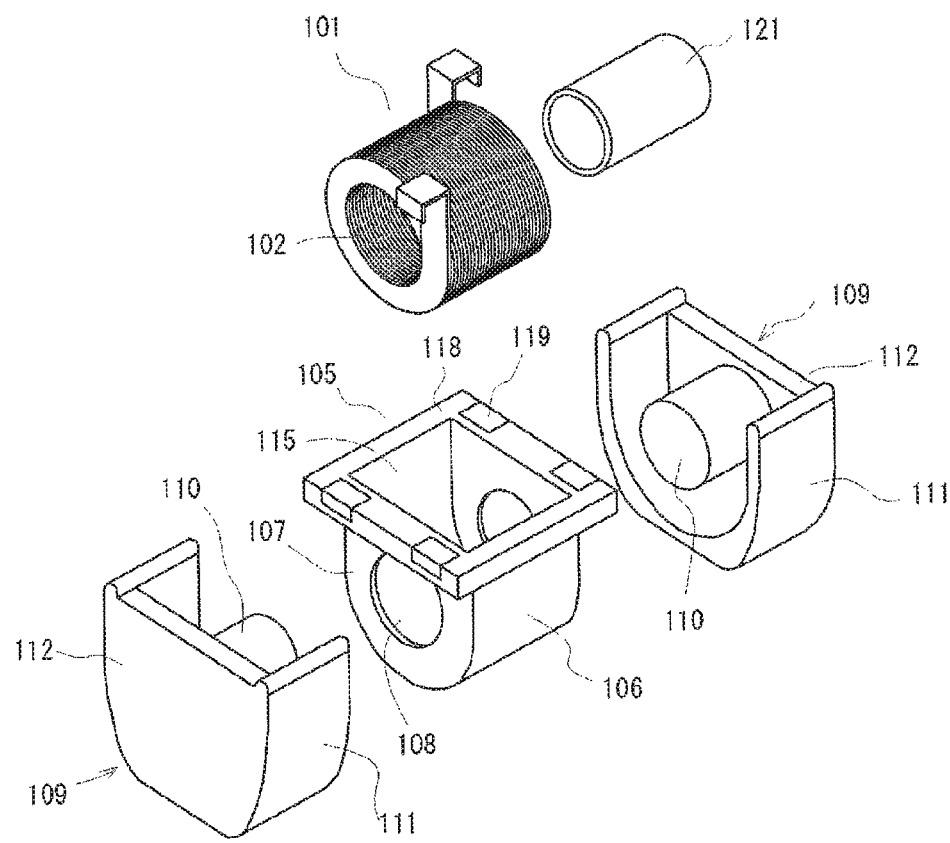
FIG. 25 is an exploded perspective view showing the structure of a conventional surface mountable reactor.

The DC superimposition characteristics of the surface mountable reactors 1 obtained as described above were measured (at a temperature of 23° C.) similarly to Example 1. FIG. 24 shows the measured DC superimposition characteristics.

The results indicate that both surface mountable reactors of this example have high inductance at low superimposed current and that, in particular, the reactor produced with High Flux has higher inductance even at higher superimposed current.

DESCRIPTION OF REFERENCE SIGNS

1 Surface mountable reactor
5 First magnetic core
10 Second magnetic core
30 Resin mount
60 Coil
65 End portion of coil

The invention claimed is:

1. A surface mountable reactor, comprising:
a coil;
a first magnetic core comprising an axial portion around which the coil is disposed and flange portions at both ends of the axial portion;
a second magnetic core that is disposed outside the coil to connect the flange portions of the first magnetic core; and
a resin mount disposed outside the coil, wherein the second magnetic core comprises a plurality of components separable toward outside the coil,
a circumference of the coil is surrounded by the second magnetic core and the resin mount,
the coil is housed in a space surrounded by (i) the flange portions of the first magnetic core, (ii) the second magnetic core, and (iii) the resin mount, and
the coil has end portions disposed outside the resin mount to form mount terminals.

2. The surface mountable reactor according to claim 1, wherein
the coil is an edgewise coil comprising a flat conductor wire, and
the end portions of the coil are extended through holes of the resin mount to form the mount terminals.

3. The surface mountable reactor according to claim 2, wherein
the mount terminals are formed of both end portions of the coil that are allowed to protrude out of the resin mount and bent in opposite directions from protruding parts of the end portions to an outer or inner part of the resin mount along a winding axis direction of the coil.

4. The surface mountable reactor according to claim 3, wherein the two mount terminals are located in a 180-degree rotationally symmetric manner in a plane where the mount terminals are disposed.

5. The surface mountable reactor according to claim 1, which has a hexahedral structure, wherein
he flange portions of the first magnetic core form two opposed faces of the hexahedral structure,
the second magnetic core forms other three faces, and
the resin mount covers another side surface of the coil between the flange portions of the first magnetic core and forms remaining one face.

6. The surface mountable reactor according to claim 1, wherein
the resin mount comprises a pair of wall portions that are so located that the coil is placed between the wall portions along a winding axis direction of the coil; magnetic core receiving portions provided outside the wall portions; and a coil receiving portion provided between the wall portions.

7. The surface mountable reactor according to claim 6, wherein
the resin mount has openings at end surfaces opposed in a winding axis direction of the coil, and
front ends of end portions of the coil are inserted in the openings.

8. The surface mountable reactor according to claim 1, wherein
the first magnetic core comprises a component serving as the axial portion and components serving as the flange portions, and
the components serving as the flange portions each have a recess in which an end of the component serving as the axial portion is engaged.

9. The surface mountable reactor according to claim 1, wherein
the flange portions of the first magnetic core each have a peripheral surface in contact with an inner surface of the second magnetic core facing the coil.

10. The surface mountable reactor according to claim 1, wherein
the flange portions of the first magnetic core are each a plate-shaped member having, at a periphery, two parallel sides and other sides linked to the two parallel sides,
one component of the second magnetic core has a cross-section comprising: an inner linear portion along one of the two parallel sides; and an inner curved portion along one of the other sides, wherein the cross-section is perpendicular to a winding axis direction of the coil,
another component of the second magnetic core has a cross-section comprising: an inner linear portion along another of the two parallel sides; and an inner curved portion along one of the other sides, wherein the cross-section is perpendicular to the winding axis direction of the coil, and
the one component and the another component are assembled to form the second magnetic core.

11. The surface mountable reactor according to claim 10, further comprising a sealing member provided to connect the components of the second magnetic core.

12. The surface mountable reactor according to claim 1, further comprising a cover member provided to fix the first magnetic core and the second magnetic core to the resin mount.

13. The surface mountable reactor according to claim 1, wherein the first magnetic core comprises a dust core comprising a magnetic metal material, and the second magnetic core comprises a ferrite magnetic core comprising a ferrite material.

14. A method for fabricating a surface mountable reactor according to claim 1,
the method comprising a first step comprising assembling a first magnetic core, one component for forming a second magnetic core, and another component for forming the second magnetic core, wherein
the first magnetic core comprises an axial portion around which the coil is disposed and flange portions that are each a plate-shaped member having, at a periphery, two parallel sides and other sides linked to the two parallel sides,
the one component for forming the second magnetic core has a cross-section comprising: an inner linear portion along one of the two parallel sides; and an inner curved portion along one of the other sides, wherein the cross-section is perpendicular to a winding axis direction of the coil,
the another component for forming the second magnetic core has a cross-section comprising: an inner linear portion along another of the two parallel sides; and an inner curved portion along one of the other sides, wherein the cross-section is perpendicular to the winding axis direction of the coil, and
the first magnetic core, the one component for forming the second magnetic core, and the another component for forming the second magnetic core are assembled in such a manner that peripheral surfaces of the flange portions of the first magnetic core are brought into contact with an inner surface of the second magnetic core facing the coil.

15. The method according to claim 14, further comprising, after the first step, a second step comprising inserting end portions of the coil into holes provided in the resin mount.

16. The method according to claim 15, further comprising, after the second step, a third step comprising forming mount terminals by bending both end portions of the coil, which protrude out of the resin mount, in opposite directions from protruding parts of the end portions to an outer or inner part of the resin mount along a winding axis direction of the coil.

17. The surface mountable reactor according to claim 1, wherein
the second magnetic core has an alphabet U-shaped cross-section in a direction perpendicular to the winding axis direction of the coil.

18. The surface mountable reactor according to claim 17, wherein
the second magnetic core is composed of assembled components having an alphabet L-shaped cross-section.

* * * * *